(12) United States Patent
Baker et al.

(10) Patent No.: US 8,441,827 B2
(45) Date of Patent: May 14, 2013

(54) POWER CONVERTER ASSEMBLY HAVING A HOUSING

(75) Inventors: Thomas M. Baker, Peoria, IL (US); Robert R. Sychra, Washington, IL (US); Keith E. Dixler, Peoria, IL (US); Jon N. Husser, McNabb, IL (US)

(73) Assignee: Caterpillar Inc., Peoria, IL (US)

( * ) Notice: Subject to any disclaimer, the term of this patent is extended or adjusted under 35 U.S.C. 154(b) by 491 days.

(21) Appl. No.: 12/721,889

(22) Filed: Mar. 11, 2010

(65) Prior Publication Data

US 2010/0232111 A1 Sep. 16, 2010

Related U.S. Application Data

(63) Continuation-in-part of application No. 12/384,183, filed on Apr. 1, 2009, now Pat. No. 7,869,208.

(60) Provisional application No. 61/159,439, filed on Mar. 11, 2009.

(51) Int. Cl.
*H05K 7/20* (2006.01)

(52) U.S. Cl.
USPC ........... 363/141; 361/689; 361/699; 361/711; 361/715

(58) Field of Classification Search .......... 361/699, 361/689, 698, 704, 707, 711, 715; 363/141
See application file for complete search history.

(56) References Cited

U.S. PATENT DOCUMENTS

| | | | |
|---|---|---|---|
| 5,828,554 A * | 10/1998 | Donegan et al. | 361/707 |
| 6,865,080 B2 | 3/2005 | Radosevich et al. | |
| 6,898,072 B2 | 5/2005 | Beihoff et al. | |
| 6,909,607 B2 | 6/2005 | Radosevich et al. | |
| 6,937,471 B1 * | 8/2005 | Haws et al. | 361/699 |
| 6,940,715 B2 | 9/2005 | Beihoff et al. | |
| 6,965,514 B2 | 11/2005 | Beihoff et al. | |
| 6,972,957 B2 | 12/2005 | Beihoff et al. | |
| 6,982,873 B2 | 1/2006 | Meyer et al. | |
| 7,016,192 B2 | 3/2006 | Beihoff et al. | |
| 7,032,695 B2 | 4/2006 | Beihoff et al. | |
| 7,061,775 B2 | 6/2006 | Beihoff et al. | |
| 7,068,507 B2 * | 6/2006 | Pfeifer et al. | 361/699 |
| 7,095,612 B2 | 8/2006 | Beihoff et al. | |
| 7,142,434 B2 | 11/2006 | Beihoff et al. | |
| 7,177,153 B2 | 2/2007 | Radosevich et al. | |
| 7,187,548 B2 | 3/2007 | Meyer et al. | |
| 7,187,568 B2 | 3/2007 | Radosevich et al. | |
| 7,212,407 B2 | 5/2007 | Beihoff et al. | |
| 7,264,045 B2 * | 9/2007 | Mehendale et al. | 165/166 |
| 7,573,701 B2 * | 8/2009 | Doberstein et al. | 361/679.01 |
| 7,869,208 B2 | 1/2011 | Husser et al. | |
| 2004/0066643 A1 | 4/2004 | Beihoff et al. | |
| 2004/0100778 A1 * | 5/2004 | Vinciarelli et al. | 361/760 |
| 2007/0235816 A1 * | 10/2007 | Moore | 257/370 |
| 2007/0242435 A1 * | 10/2007 | Nakamura et al. | 361/699 |
| 2009/0205809 A1 * | 8/2009 | Wan et al. | 165/80.4 |

* cited by examiner

*Primary Examiner* — Adolf Berhane
*Assistant Examiner* — Emily Pham
(74) *Attorney, Agent, or Firm* — William A. Beckman

(57) ABSTRACT

A power converter assembly includes a housing and at least one transistor module. The housing has a liquid cooled heat transfer surface. The at least one transistor module is mounted directly to the liquid cooled heat transfer surface and positioned at least partially within the housing.

13 Claims, 11 Drawing Sheets

POWER CONVERTER ASSEMBLY HAVING A HOUSING

CLAIM FOR PRIORITY

This application claims the benefit of U.S. Provisional Application No. 61/159,439, filed Mar. 11, 2009, and U.S. application Ser. No. 12/384,183, filed Apr. 1, 2009.

TECHNICAL FIELD

The present disclosure relates generally to a power converter of a type used in electric propulsion system for machines, and relates more particularly to a housing of such a power converter for heat transference and packing density.

BACKGROUND

A device known generally as a power converter is often used in electrical systems to receive electrical power from an electrical power source such as a generator, condition the electrical power, and thenceforth supply the conditioned electrical power to one or more electrically powered devices. Operation of a power converter in this manner tends to generate heat, which must be dissipated to optimize efficiency of the power converter and in some instances to avoid damage or degradation of certain of the components. Many standard power converters utilize an air cooling mechanism such as a fan to blow cooling air over the various components and dissipate heat. This strategy may work well in certain environments, however, in others such as debris-laden or wet environment, air cooling has its limitations. Certain manufacturers have proposed power converter designs wherein the power converter is positioned within a liquid sealed housing to protect the power converter electronic components from debris, water, etc. Fluid sealing of power converter components within a housing, however, tends to complicate heat rejection, and generally makes air cooling ineffective.

As an alternative to air cooling, one strategy for dissipating heat from power converter electronic components involves the use of a cooling plate or the like to circulate a cooling fluid through or past a heat exchanger which is in thermal contact with electronic components of the power converter. While certain liquid cooling strategies have seen some success, there is room for improvement. In particular, implementing liquid cooling of a power converter tends to create various mechanical and structural challenges to packaging the electronic components compactly, while still allowing for sufficient heat rejection.

U.S. Pat. No. 7,068,507 to Pfeifer et al. proposes an electronic converter assembly including a liquid cooled heat sink. Pfeifer et al. illustrate a plurality of cylindrical capacitors and power switches which are apparently adapted to condition electrical power in a manner similar to that described above, namely, receiving AC input, converting the AC input to DC, then outputting AC power suited for powering electrically powered components. The design of Pfiefer et al., such as is illustrated in FIGS. 2 and 3, appears dictated at least in part by the cooling strategy chosen. In other words, an arrangement of the electronic components appears to have been based at least in part on the preexisting design of the cooling plate. While Pfiefer et al. may be successful in certain instances, the design is apparently purpose built for a particular cooling strategy and for certain types of electronic components, rendering it inferior or inapplicable to others.

SUMMARY

In one aspect, a power converter assembly includes a housing and at least one transistor module. The housing has a liquid cooled heat transfer surface. The at least one transistor module is mounted directly to the liquid cooled heat transfer surface and positioned at least partially within the housing.

In another aspect, a machine is provided. The machine includes an engine, an electrical generator, a power converter, and at least one electric propulsion motor. The electrical generator is coupled to the engine. The power converter is in communication with the electrical generator and has a housing with a liquid cooled heat transfer surface and at least one transistor module mounted directly to the liquid cooled heat transfer surface and positioned at least partially within the housing. The at least one electric propulsion motors is in communication with the power converter.

BRIEF DESCRIPTION OF THE DRAWINGS

Each of the illustrations described below is pictorial in nature and is not intended to be an exact representation of any actual components.

DETAILED DESCRIPTION

Figure 1:
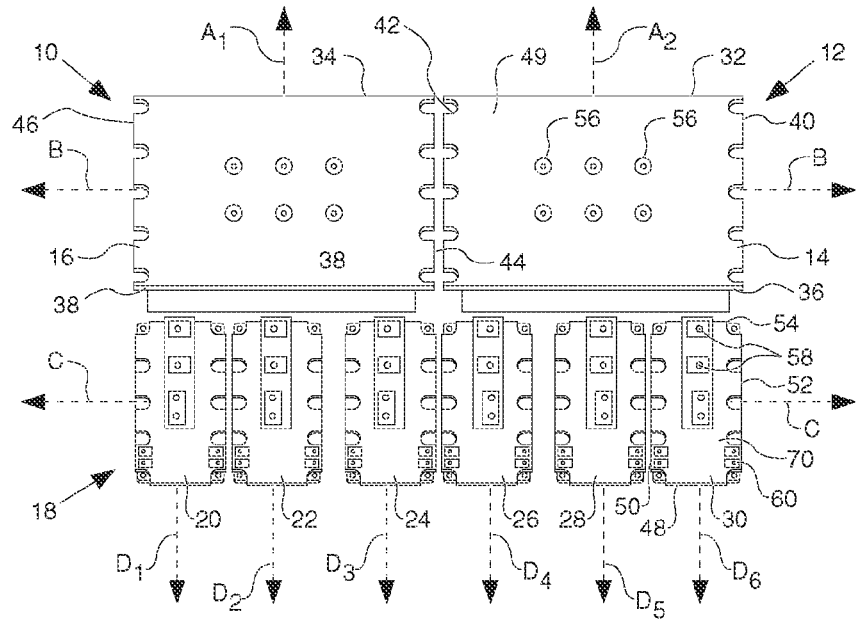
FIG. 1 illustrates an electronics assembly for a power converter, according to one embodiment.

Referring to FIG. 1, there is shown an electronics assembly 10 according to one embodiment. The electronics assembly 10 may be used in a power converter such as a power converter assembly for a multiple phase AC electric drive propulsion system in a machine, as further described herein. Electronics assembly 10 may include a capacitor subassembly 12 for conditioning electrical power in a conventional manner in a power converter. Capacitor subassembly 12 may include a plurality of capacitor units 14 and 16 each having a rectangular configuration and defining a major capacitor axis and a minor capacitor axis which is oriented normal to and bisects the corresponding major capacitor axis. Electronics assembly 10 may further include a transistor subassembly 18 for power switching in a power converter in a conventional manner, and including a plurality of transistor modules each defining a major module axis and a minor module axis which is oriented normal to and bisects the major module axis. The plurality of transistor modules may each include an insulated gate bipolar transistor module, a variety of which are well known and widely used in electrical power systems, and referred to hereinafter as "IGBT" modules. As will be further apparent from the following description, the components of electronics assembly 10, including those shown in FIG. 1 and also other components described below, may be uniquely arranged to enable heat dissipation during operation, while being positioned in a relatively dense and compact configuration.

To this end, capacitor subassembly 12 may include a first packaging arrangement where each of the major capacitor axes are co-linear with one another and each of the minor capacitor axes are parallel but not co-linear with one another. In FIG. 1, the rectangular configuration of each one of capacitor units 14 and 16 is readily apparent. Capacitor unit 16 defines a minor capacitor axis $A_1$ and capacitor unit 14 defines a minor capacitor axis $A_2$. It may be noted that minor capacitor axes $A_1$ and $A_2$ are oriented parallel with one another and are not co-linear. Axis B is shown as common to each of capacitor units 14 and 16 and represents the co-linear major axes of each of capacitor units 14 and 16. It should be appreciated that the term "minor capacitor axis" as used herein refers to an axis defined by the corresponding capacitor unit 14, 16 which extends through a geometric center thereof and intersects long sides of the corresponding rectangular configuration as shown. The term "major capacitor axis" as used herein refers to an axis defined by the corresponding capacitor unit which intersects the geometric center of the corresponding capacitor unit and also intersects short sides of the corresponding rectangular configuration. It may further be noted from FIG. 1 that each of the plurality of transistor or IGBT modules 20-30 also includes a generally rectangular configuration. The terms "major module axis" and "minor module axis" are used herein in a manner consistent with use of the corresponding terms in regard to capacitor units 14 and 16. In other words, the major module axes, identified respectively for each of IGBT modules 20-30 via axes $D_1$-$D_6$, intersect a geometric center of the corresponding IGBT module and also intersect short sides of the rectangular configuration. Similarly, the term minor module axis refers to an axis intersecting a geometric center of the corresponding IGBT module and also intersecting long sides of the corresponding rectangular configuration. Example locations of major capacitor axes, minor capacitor axes, major module axes and minor module axes, will be further apparent from an examination of the attached drawings as well as the following description. In any event, in electronics assembly 10 transistor subassembly 18 may include a second packaging arrangement where each of the minor module axes, shown via axis C, are co-linear with one another, and each of major module axes $D_1$-$D_6$ are parallel but not co-linear with one another. It may be noted that major module axes $D_1$-$D_6$ are oriented parallel, but not coplanar with minor capacitor axes $A_1$ and $A_2$. Further, major capacitor axes B may be oriented normal to and non-coplanar with major module axes $D_1$-$D_6$. This configuration is also apparent in FIG. 2. Further, in the second packaging arrangement of transistor subassembly 18, each of a plurality of planar heat dissipation surfaces 75 associated one with each of IGBT modules 20-30 may be positioned in a common heat transfer plane, as further described herein.

In one embodiment, capacitor subassembly 12 may include a total of two identical capacitor units. Each of capacitor units 14 and 16 may include a plurality of peripheral edges which define a rectangular configuration thereof. Capacitor unit 14 may include a first peripheral edge 32 which includes a first long peripheral edge and a second peripheral edge 36 which includes a second long peripheral edge. Capacitor unit 14 may further include a third peripheral edge 40 which includes a first short peripheral edge and a fourth peripheral edge 42 which includes a second short peripheral edge. Capacitor unit 16 may include a first peripheral edge 34 which includes a first long peripheral edge, a second peripheral edge 38 which includes a second long peripheral edge, a third peripheral edge 46 which includes a first short peripheral edge and a fourth peripheral edge 44 which includes a second short peripheral edge. Each of capacitor units 14 and 16 may further include a set of electrical capacitor connectors 56 which are located on an upper side 49 of the corresponding capacitor unit. It may be noted that upper side 49 includes a rectangular edge portion 57 which overhangs a main body portion 59. It should be appreciated that the present description of the rectangular configuration of capacitor units 14 and 16, and definitions for axes $A_1$, $A_2$ and C, refer to main body portion 59. Capacitor unit 16 may include a similar edge portion and main body portion to capacitor unit 14. In one embodiment, each of capacitor units 14 and 16 may include a cylindrical roll of conductive metal and dielectric material familiar to those skilled in the art, which is squeezed or otherwise deformed or arranged during manufacturing into a roughly rectangular shape, and positioned within potting material via known techniques to render the generally rectangular configuration of the main body portion 59 of the corresponding capacitor unit. In one embodiment, each of capacitor units 14 and 16 may include a total of six electrical capacitor connectors which connect with the corresponding roll within the respective capacitor unit.

Transistor subassembly 18 may include a total of six IGBT modules in one embodiment. IGBT modules 20-30 may be identical IGBT modules and, hence, the following description of the single IGBT module 30 should be understood to refer similarly to each of the other five IGBT modules. IGBT module 30 may include a plurality of peripheral edges, which define a generally rectangular configuration, including a first peripheral edge 52 or first long edge and a second peripheral edge 50 or second long edge. IGBT module 30 may further include a third peripheral edge 48 or first short edge and a fourth peripheral edge 54 or second short edge. IGBT module 30 may further include a plurality of electrical power connectors 58 for connecting with capacitor subassembly 12 and for connecting with power input and output components of a power converter, as further described herein.

Figure 3A:
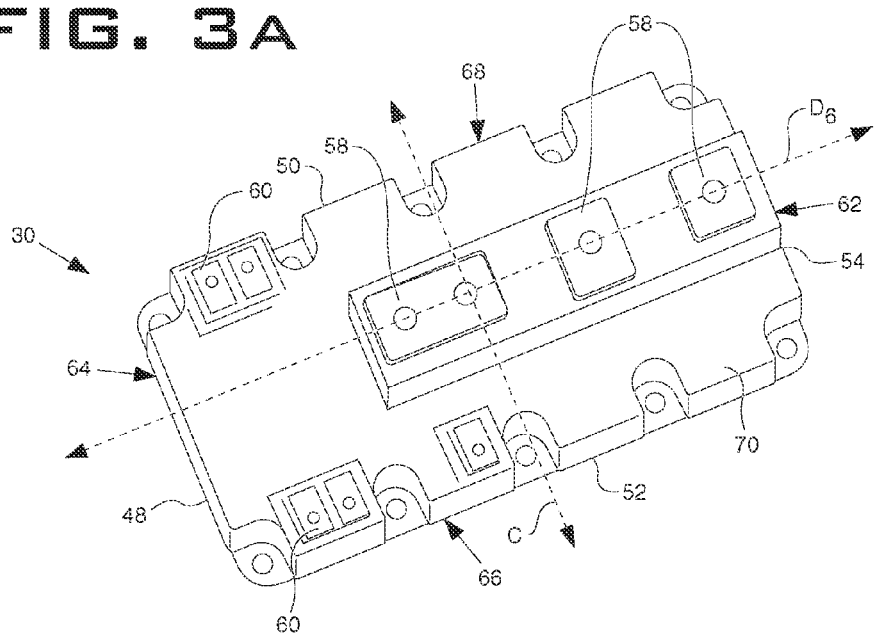
FIG. 3A illustrates an Insulated Gate Bipolar Transistor ("IGBT") module which may be used with the electronics assembly of FIGS. 1 and 2.
Figure 3B:
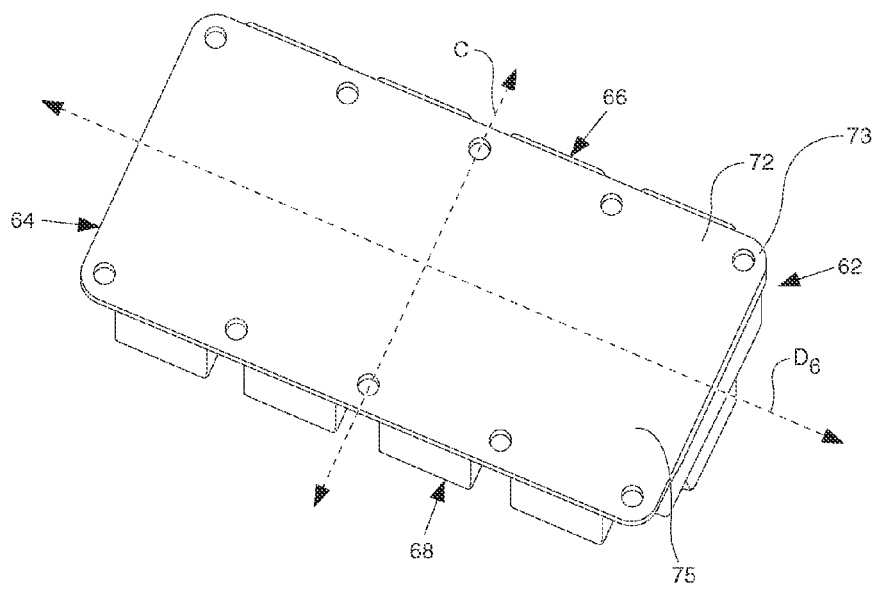
FIG. 3B illustrates the IGBT module of FIG. 3A in a different view.

Referring also to FIG. 3A and FIG. 3B, IGBT module 30 may include an upper module surface or upper module side 70 and a lower module surface or lower module side 72. In one embodiment, lower module side 72 may include a heat dissipation surface 75 defining a rectangular configuration as shown. IGBT module 30 may further include a first module end 64 corresponding to peripheral edge 48 and a second module end 62 corresponding to peripheral edge 54. Lower module side 72 may include a rectangular heat transfer panel 73 formed of a thermally conductive material, such as a metallic material, whereupon heat dissipation surface 75 is located. IGBT module 30 may also include a first lateral module side 66 corresponding to peripheral edge 52 and a second lateral module side 68 corresponding to peripheral edge 50. It may be noted from the FIG. 3A illustration that major module axis $D_6$ intersects peripheral edge 54 at module end 62 and also intersects peripheral edge 48 at module 64. Minor module axis C intersects peripheral edge 52 at lateral module side 66 and intersects peripheral edge 50 at lateral module side 68.

FIG. 3A further illustrates an arrangement of electrical power connectors 58 which is asymmetric about a plane which includes minor module axis C and is oriented normal to major module axes $D_1$-$D_6$. An arrangement of electrical power connectors 58 may be understood to define a module orientation of IGBT module 30. Returning to FIG. 1, it may be noted that each of IGBT modules 20-30 may include an identical module orientation within the second packaging arrangement, as defined by an arrangement of their respective electrical power connectors 58. Each of IGBT modules 20-30 may further include an orientation where a module end, such as module end 54, having one of electrical power connectors 58 located adjacent thereto, is positioned adjacent to and abuts capacitor subassembly 12. As used herein, the term "abuts" should not be understood to strictly mean that the respective parts must be touching. Rather, "abuts" means that the subject components are adjacent, and no additional electronics components are positioned between IGBT modules 20-30 and capacitor subassembly 12.

Figure 2:
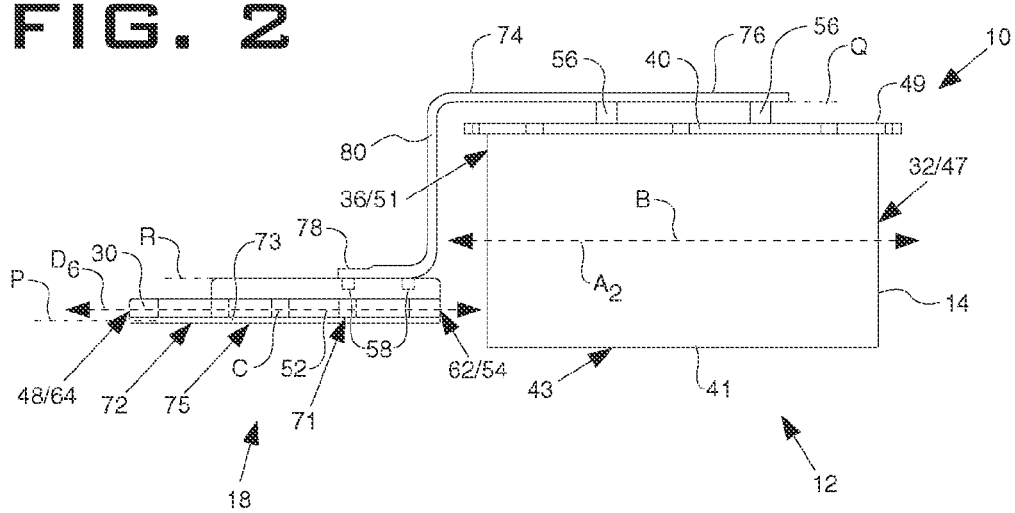
FIG. 2 illustrates a side view of a portion of the assembly of FIG. 1.

Turning now to FIG. 2, there is shown a side view of electronics assembly 10 as it might appear when coupled with an electrical connecting device such as a DC bus bar 74. It may be noted from FIG. 2 that capacitor unit 14 includes a plurality of lateral sides of main body portion 59 which each include a surface located thereon. As further described herein, the lateral sides/surfaces of each capacitor unit 14, 16 may include heat transfer surfaces for dissipating heat from the corresponding capacitor unit to a heat exchange element such as a power converter housing. In particular, main body portion 59 of capacitor unit 14 is shown having an end surface 41, a lower surface 43, a first side surface 47 and a second side surface 51. Side surfaces 47 and 51 may correspond with long peripheral edges 32 and 36, respectively, whereas end surface 41 may correspond with short peripheral edge 40. It may further be noted that electrical capacitor connecters 56 project upwardly from upper side 49 of capacitor unit 14 and define a first connecting plane "Q". Electrical power connectors 58 of IGBT module 30 are also shown, and define a second connecting plane "R" which may be parallel and non-coplanar with plane Q in one embodiment.

A heat transfer plane "P" corresponding to the heat transfer plane occupied by the heat dissipation surface 75 of each of IGBT modules 20-30 is also shown in FIG. 2. As discussed above, heat dissipation surface 75 may be a surface of panel 73. Together, the heat dissipation surfaces/panels 75 and 73 of each of IGBT modules 20-30 may include or comprise a portion of a heat dissipation mechanism 71 of electronics assembly 10. It may be noted that heat transfer plane P may be parallel with each of planes Q and R, and non-coplanar therewith. In one embodiment, DC bus bar 74 may include a first bus bar end 76 located in first connecting plane Q and electrically connecting with electrical capacitor connectors 56. DC bus bar 74 may further include a second bus bar end 78 located in second connecting plane R and electrically connecting with electrical power connectors 58. DC bus bar 74 may also include a stepped profile defined by a middle portion 80 between DC bus bar end 76 and DC bus bar end 78. It may be noted that a configuration of DC bus bar 74 may define a relative location and orientation among planes Q, R and P in one embodiment. The stepped profile of DC bus bar 74 may include a stepped cross sectional profile in one embodiment. As will be further apparent from FIGS. 4 and 6, DC bus bar 74 may also include a stepped edge profile between DC bus bar end 76 and DC bus bar end 78. DC bus bar 74 may include two laminated conductive sheets electrically separate from one another in one embodiment, and may be preconfigured during manufacturing with a plurality of apertures/holes therein for electrically connecting with capacitor subassembly 12 and transistor subassembly 18. DC bus bar 74 may further be understood as a supporting mechanism which supports capacitor subassembly 12 in the first packaging configuration via its mechanical/electrical connections therewith, and also supports transistor subassembly 18 in the second packaging configuration via its electrical/mechanical connections therewith.

Figure 4:
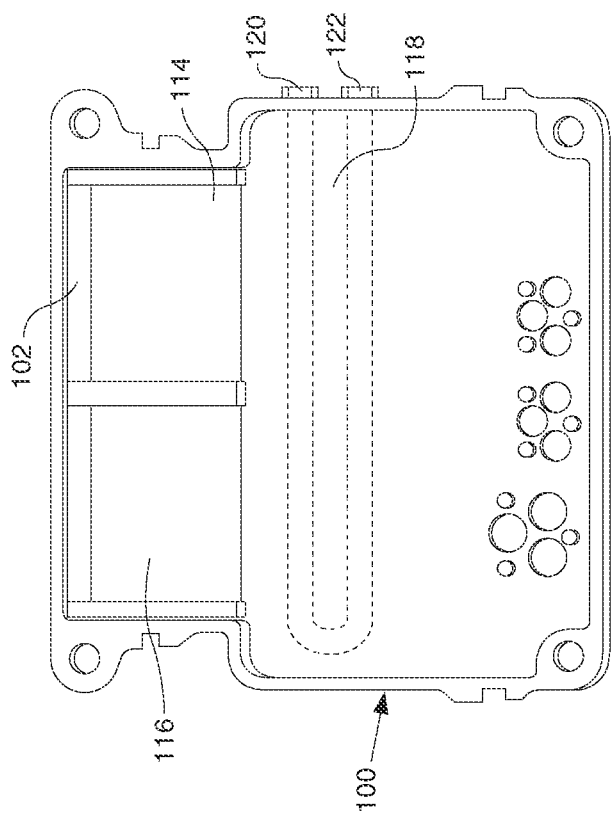
FIG. 4 illustrates an electronics assembly for a power converter, according to one embodiment.

Turning now to FIG. 4, there is shown electronics assembly 10 in a top view assembled with other components in preparation for placing in service in a power converter housing. It may be noted from FIG. 2 that a plurality of AC electrical connection bars 88 may connect three IGBT modules of transistor subassembly 18 with an AC input interface 84. AC input interface 84 may receive a multiple phase AC input, such as a three-phase AC input, from a source of electrical power such as an electrical generator. The three IGBT modules 20, 22 and 24 of transistor subassembly 18 coupled with AC input interface 84 may comprise a power converter which transforms AC input to DC at capacitor subassembly 12. A plurality of AC electrical connection bars 90 connect a second three of IGBT modules 26, 28, 30 of transistor subassembly 18 with a first AC output interface 86a and a second AC output interface 86b. The three IGBT modules 26, 28, 30 connecting with AC output interfaces 86a and 86b may comprise a power inverter which transforms DC from the capacitor subassembly 12 to AC output. AC output interfaces 86a and 86b may be configured to connect with an electrically powered device, as further described herein. During braking (slowing) an electric drive machine which employs electronics assembly 10, the direction of power flow may be changed such that AC interface 84 acts as an AC output interface and AC interfaces 86a and 86b act as AC input interfaces. A plurality of current sensors 92 may be provided which are coupled with electrical connection bars 88 and 90 in a conventional manner.

Figure 5:
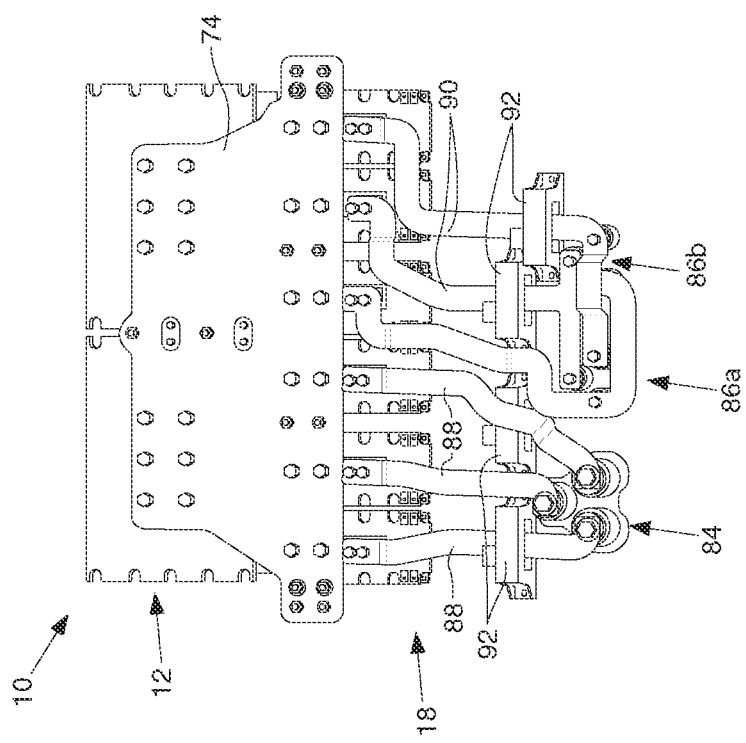
FIG. 5 illustrates a power converter housing, according to one embodiment.

Turning to FIG. 5, there is shown a power converter housing 100 according to one embodiment. Power converter housing 100 may include a cast metallic housing formed, for example, of a relatively highly heat conductive material such as aluminum. Power converter housing 100 may include a liquid cooled housing which is configured to receive electronics assembly 10 and fluidly seal electronics assembly 10 therein via a power converter housing cover (not shown). Power converter housing 100 may further include a liquid inlet fitting 120 adapted to receive a cooling liquid for circulation via an internal cooling circuit of power converter housing 100, and may further include a liquid outlet 122 for discharging liquid after flowing through power converter housing 100 to a radiator or the like. Power converter housing 100 may further include an inner surface 102. In one embodiment, inner surface 102 may serve as a support mechanism in addition or alternatively to DC bus bar 74 for supporting capacitor subassembly 12 in the first packaging arrangement and for supporting transistor subassembly 18 in the second packaging arrangement. In one embodiment, capacitor subassembly 12 may be positioned within power converter housing 100 such that surfaces 43, 41, 47 and 51 of capacitor unit 14 are in heat transference contact with inner surface 102. Capacitor unit 16 may have corresponding surfaces which are similarly in heat transference contact with inner surface 102. It may also be noted that each of capacitor units 14 and 16 includes a lateral side corresponding with peripheral edges 42 and 44, respectively. This lateral side, which is not visible in the drawings, will also be in heat transference contact with inner surface 102 when capacitor subassembly 12 is received in power converter housing 100. Power converter housing 100 may further include a first well 114 which is defined by inner surface 102 and corresponds with capacitor unit 14, and a second well 116 also defined by inner surface 102 which corresponds with capacitor unit 16. Power converter housing 100 may still further include a heat transfer surface 118 which is part of inner surface 102. Heat transfer surface 118 is configured to contact each heat dissipation surface 75 of each of the IGBT modules of transistor subassembly 18. In one embodiment, a suitable thermal grease or the like may be used to coat surfaces of power converter housing 100 which contact components of electronics assembly 10. Power converter housing 100 may include a monolithic, single piece cast molding in one embodiment, where inner surface 102 is a molded inner surface shaped in a manner which corresponds with the first packaging configuration of capacitor subassembly 12 and also corresponds with the second packaging configuration of transistor subassembly 18.

Figure 6:
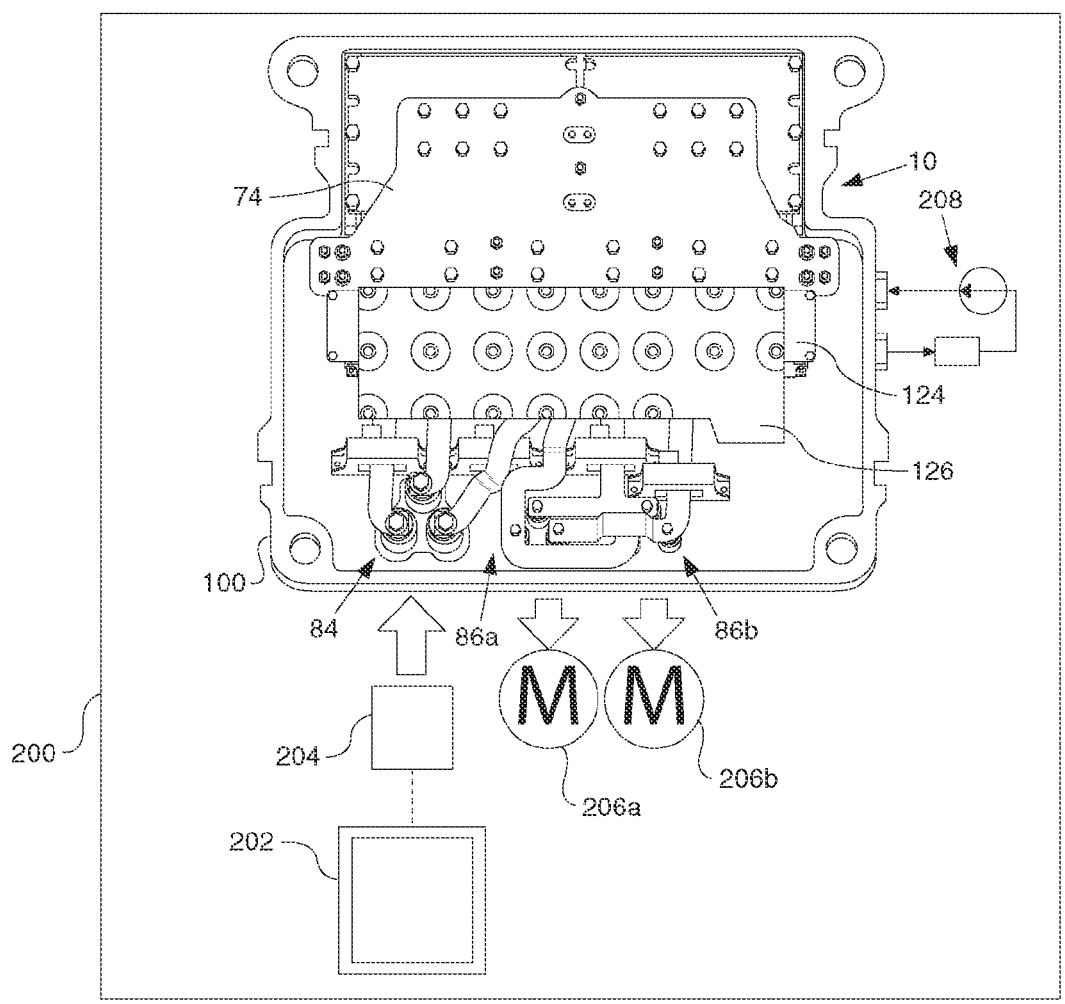
FIG. 6 is a diagrammatic view of a machine having an electrical propulsion system, according to one embodiment.

Turning now to FIG. 6, there is shown a machine 200 which includes a combustion engine such as an internal combustion engine 202 coupled with and configured to power an electrical generator 204. Electrical generator 204 may include a three-phase electrical generator which is adapted to supply electrical power to AC input interface 84 in a conventional manner. Machine 200 may further include one or more electric propulsion motors, and in one embodiment may include a first electric propulsion motor 206a coupled with AC output interface 86a and a second electric propulsion motor 206b coupled with AC output interface 86b. In one embodiment, machine 200 may be a mobile machine such as a track-type tractor or the like having propulsion motors 206a and 206b coupled with ground engaging elements (not shown), however, the present disclosure is not thereby limited. Thus, in one embodiment electric propulsion motors 206a and 206b might be traction motors. Also shown in FIG. 6 is power converter housing 100 having assembled electronics assembly 10 positioned therein, to form a power converter 11. In one embodiment, a bridge 124 may be positioned within power converter housing 100 and may include a printed control board 126 mounted thereon. Printed control board 126 may connect with electrical control connectors 60 for controlling power switching in each IGBT module 20-30, and may be further configured to connect via a connector assembly 180 or the like with a control module positioned outside of power converter housing 100.

Returning briefly to FIG. 2, it may be recalled that first connecting plane Q and second connecting plane R are parallel but non-coplanar. In one embodiment, control board 126 and bridge 124 may be positioned at least partially between first connecting plane Q and second connecting plane R, resulting in a compact arrangement. A cooling system 208 may be provided as shown in FIG. 6 which is adapted to circulate a cooling liquid through power converter housing 100 for cooling components of electronics assembly 10.

Figure 7:
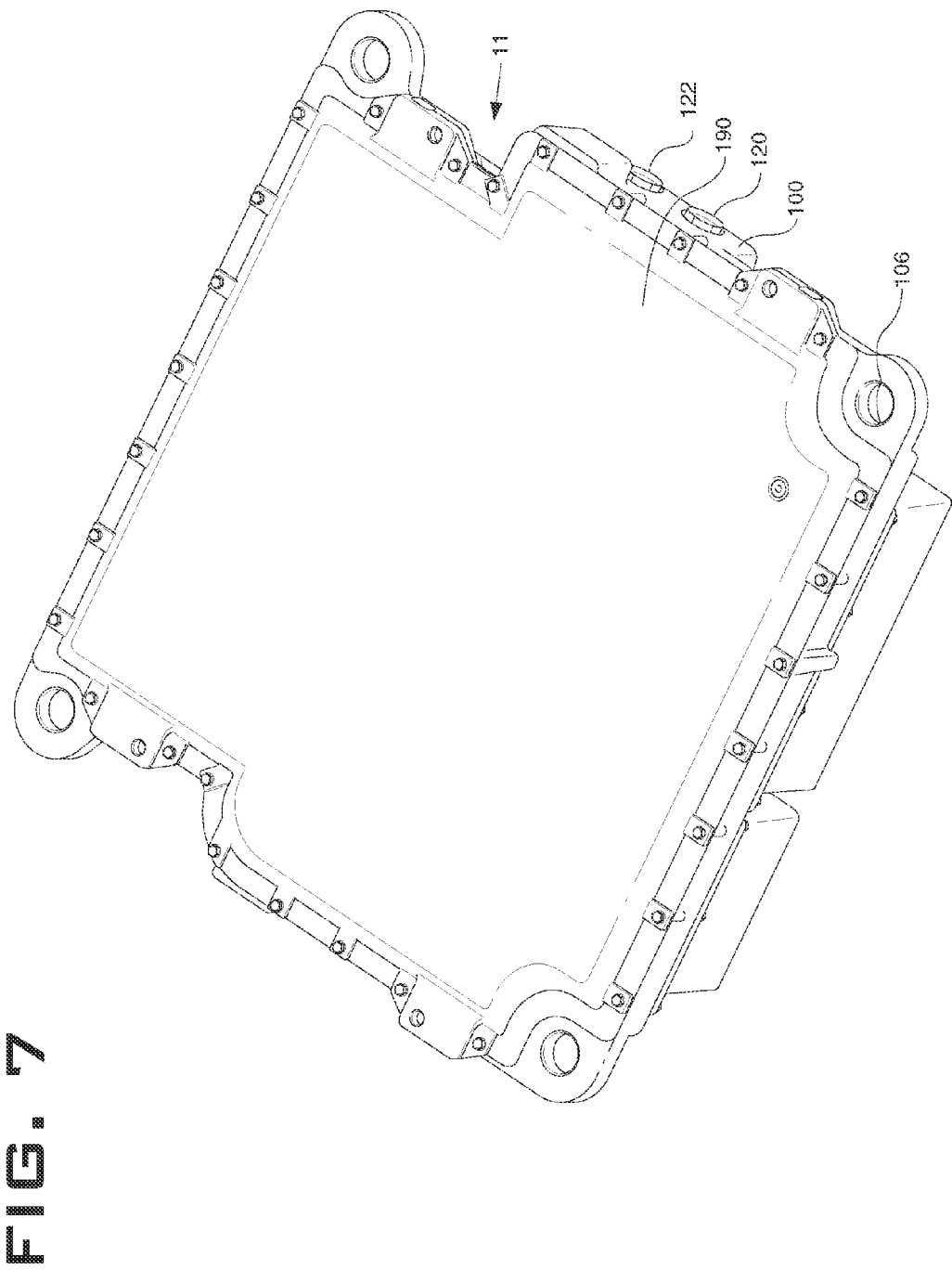
FIG. 7 illustrates a perspective view of a rear portion of one embodiment of a power converter assembly, with the cover shown attached to the housing.

FIG. 7 illustrates the back side of power converter 11 with a cover 190 shown mounted to housing 100. Cover 190 is adapted to fluidly seal electronics assembly 10 in housing 100, for protection from dirt, debris, mechanical damage, water, etc. Cover 190 may be bolted to housing 100. Power converter 11 is also equipped with a plurality of mounting bosses 106. Power converter 11 may be mounted to machine 200 via mounting bosses 106. In one embodiment, machine 200 may be a track-type tractor (not shown), and power converter 11 may be mounted to a light fabrication structure such as the fuel tank, positioned behind and below the operator cabin and out of the mud and earth that machine 200 may work and travel through. Cover 190 may be made from the same material as housing 100, such as 356-T6 Aluminum and may also be sand cast, although other materials and other manufacturing methods may be used. Cover 190 may also include a pressure and vacuum test port (not shown) to allow the integrity of the seal between cover 190 and housing 100 to be checked at assembly and monitored during operation of machine 200.

Figure 8:
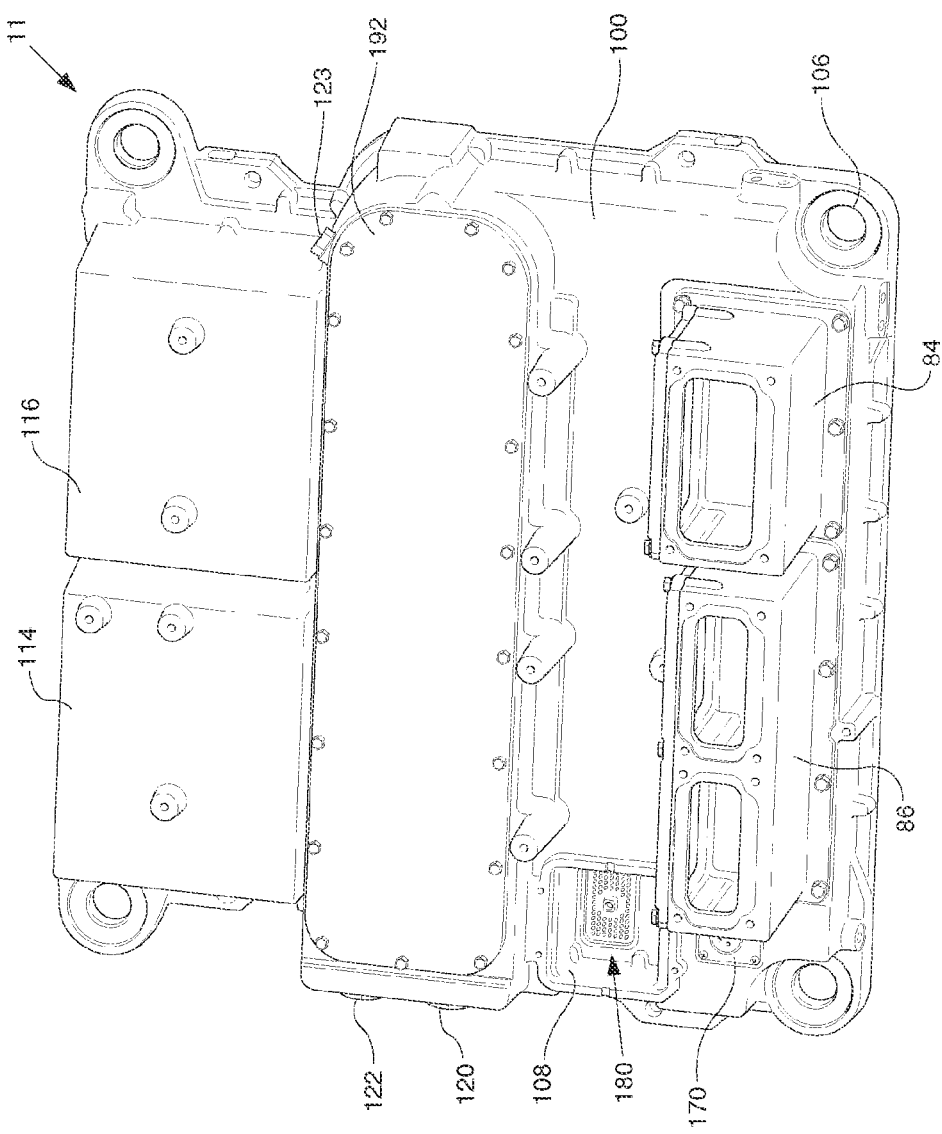
FIG. 8 illustrates a perspective view of a front portion of one embodiment of the power converter assembly of FIG. 7.

FIG. 8 illustrates the front side of power converter 11 with a fluid passage cover 192 shown mounted to housing 100. Fluid passage cover 192 may be a flat plate and is adapted to fluidly seal to housing 100, for fluidly isolating a fluid passage 130, shown in FIG. 9. Fluid passage cover 192 may be sealed to housing 100 with an o-ring seal, a gasket, or other known sealing techniques and may be made of the same material as housing 100. Housing 100 has an air purge port 123 in communication with fluid passage 130, to allow the integrity of the seal between fluid passage cover 192 and housing 100 to be checked at assembly and monitored during operation of machine 200. The other side of AC input interface 84 and AC output interface 86 are shown extending through housing 100. Housing 100 is also shown with a control board connector opening 108 through which connector assembly 180 extends. A high voltage accessory connector 170 also extends through housing 100, and may be used to direct power from power converter 11 to high voltage accessories (not shown), such as an electric water pump, an electric compressor, etc., either directly or through a separate accessory power converter (not shown).

Figure 9:
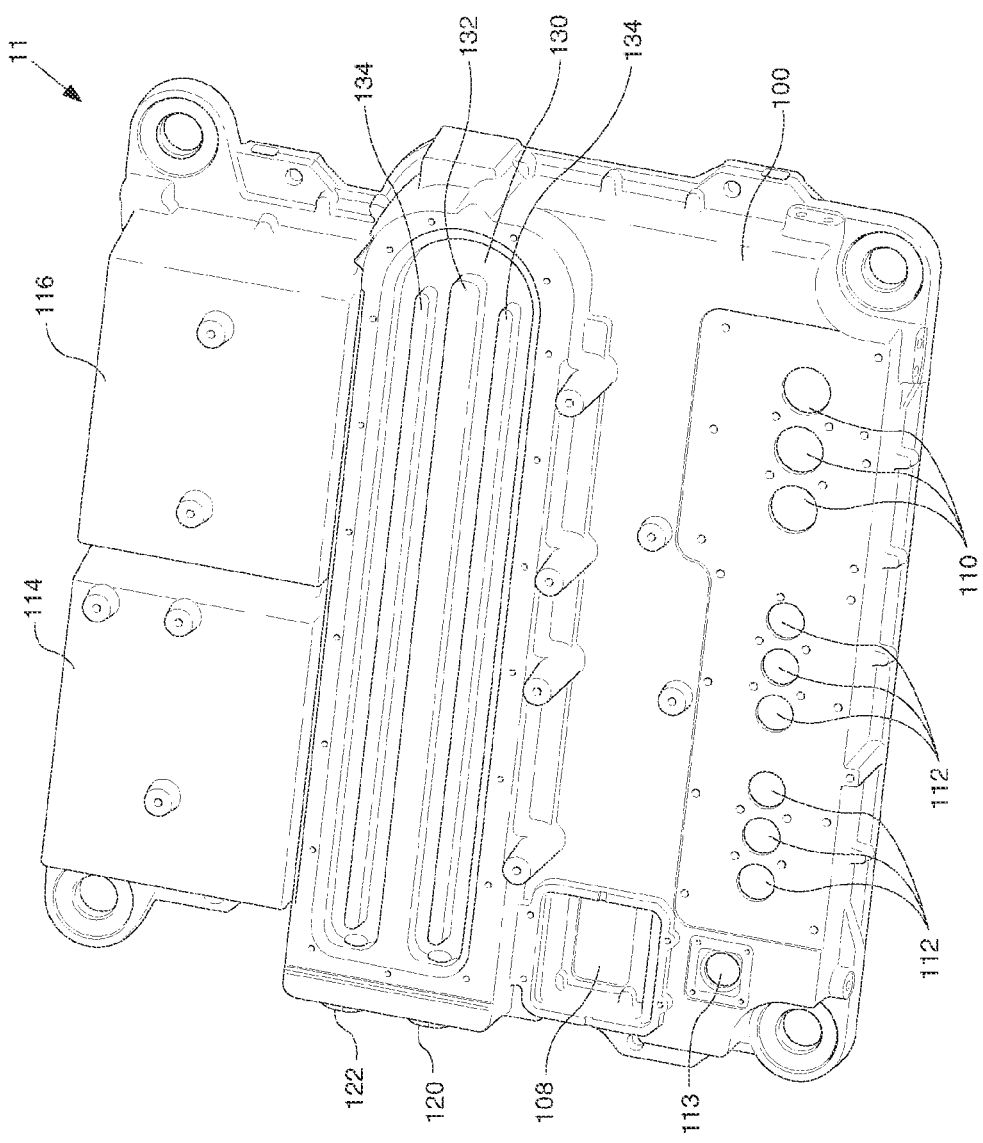
FIG. 9 illustrates a the power converter assembly of FIG. 8, with the fluid passage cover and AC output and AC input interface covers shown removed.

FIG. 9 illustrates fluid passage cover 192 removed from housing 100, revealing an internal cavity in housing 100 through which fluid passage 130 extends. Fluid passage 130 allows for a high flow of coolant with low pressure drop. Fluid passage 130 is illustrated in a "U"-shaped channel, with a central divider 132 directing flow from inlet 120 to outlet 122. Fluid passage 130 may also be equipped with a plurality of secondary dividers 134 which partition flow. Dividers 132, 134 may provide an increased surface area for coolant flowing through fluid passage 130 to come into contact with housing 100. Turbulators, fins, and other features may be added to fluid passage 130 to increase the heat transference from the heat transfer surface 118 to the coolant. Dividers 132, 134 also provide for increased material so that IGBT modules 20-30 and bridge 124 may be mounted directly to heat transfer surface 118, decreasing the needed thickness of housing 100 and increasing the heat transfer rate from electronics assembly 10 to coolant in fluid passage 130. Control board connector opening 108, a high voltage accessory opening 113, AC input openings 110 and AC output openings 112 extend through housing 100 and allow connector assembly 180, high voltage accessory connector 170, AC input interface 84, and AC output interface 86 access to electronics assembly 10 within housing 100.

Figure 10:
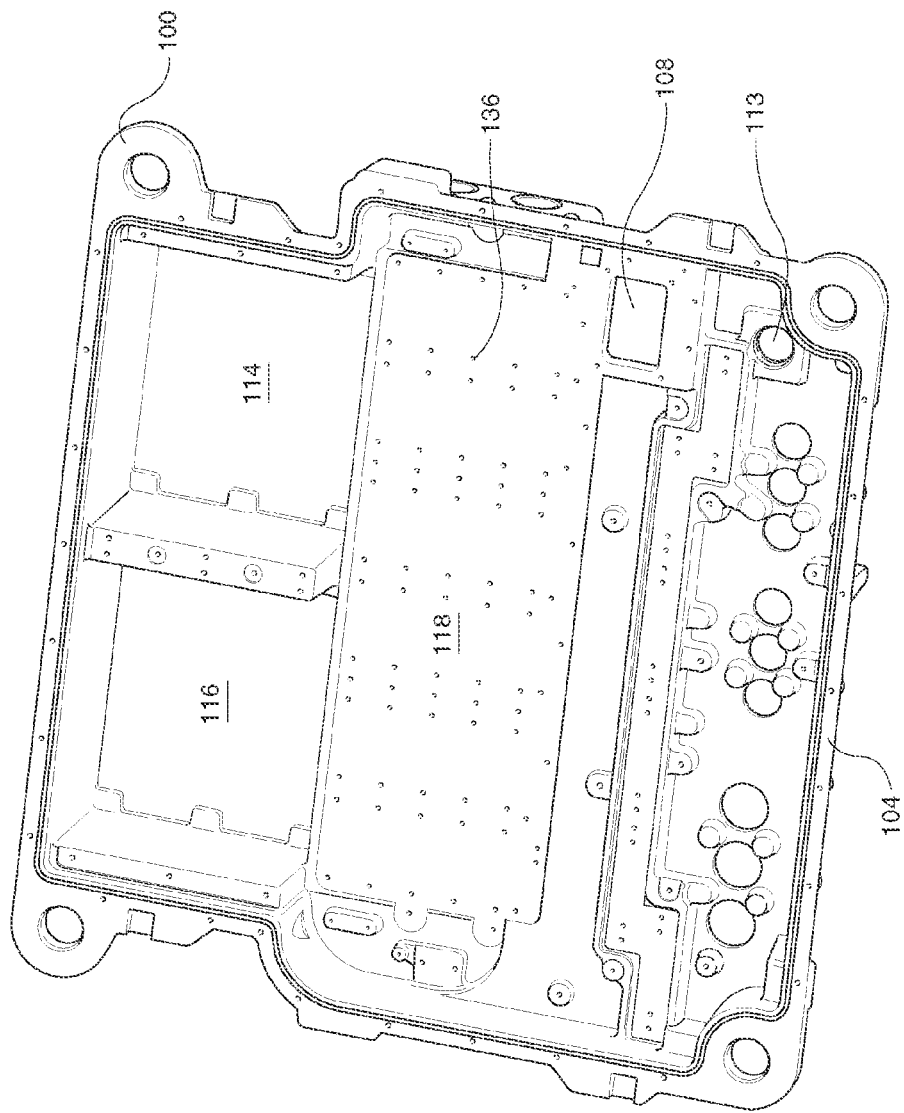
FIG. 10 illustrates the interior of a power converter housing, according to one embodiment.

FIG. 10 illustrates the inside of housing 100, with heat transfer surface 118 shown machined into housing 100 and positioned opposite the fluid passage 130. Heat transfer surface 118 is liquid cooled via conduction as cooling fluid flows through the cooling system 208. Heat transfer surface 118 is provided with a plurality of mounting holes 136 that extend through the heat transfer surface 118 and at least partially into dividers 132, 134, as discussed above. FIG. 10 also illustrates a sealing channel 104 extending along the periphery of housing 100. An o-ring seal, gasket, or other seal may be placed within the sealing channel 104 to fluidly seal cover 190 to housing 100.

Figure 11:
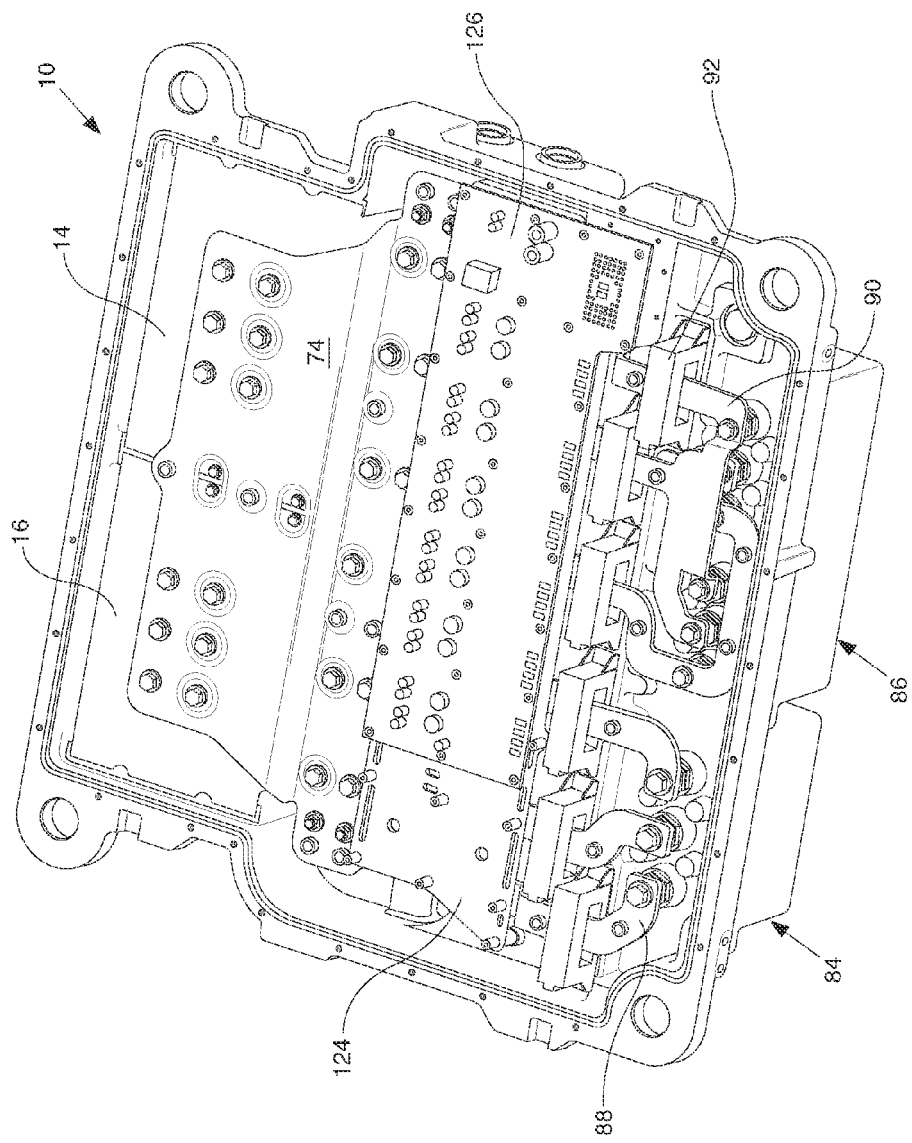
FIG. 11 illustrates the electronics assembly shown mounted to the housing of FIG. 10.
Figure 12:
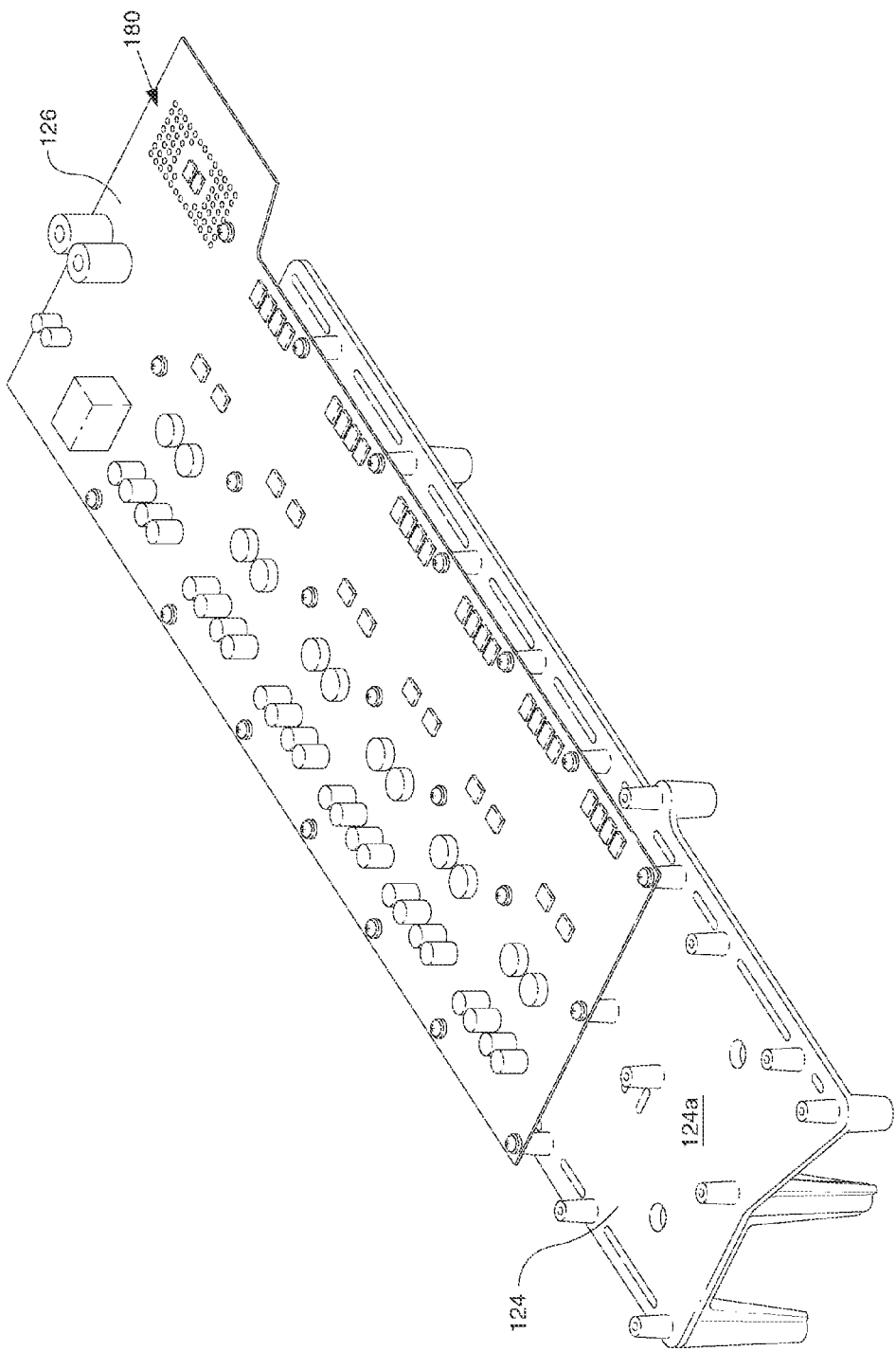
FIG. 12 is a detail view of the control board and bridge of FIG. 11.
Figure 13:
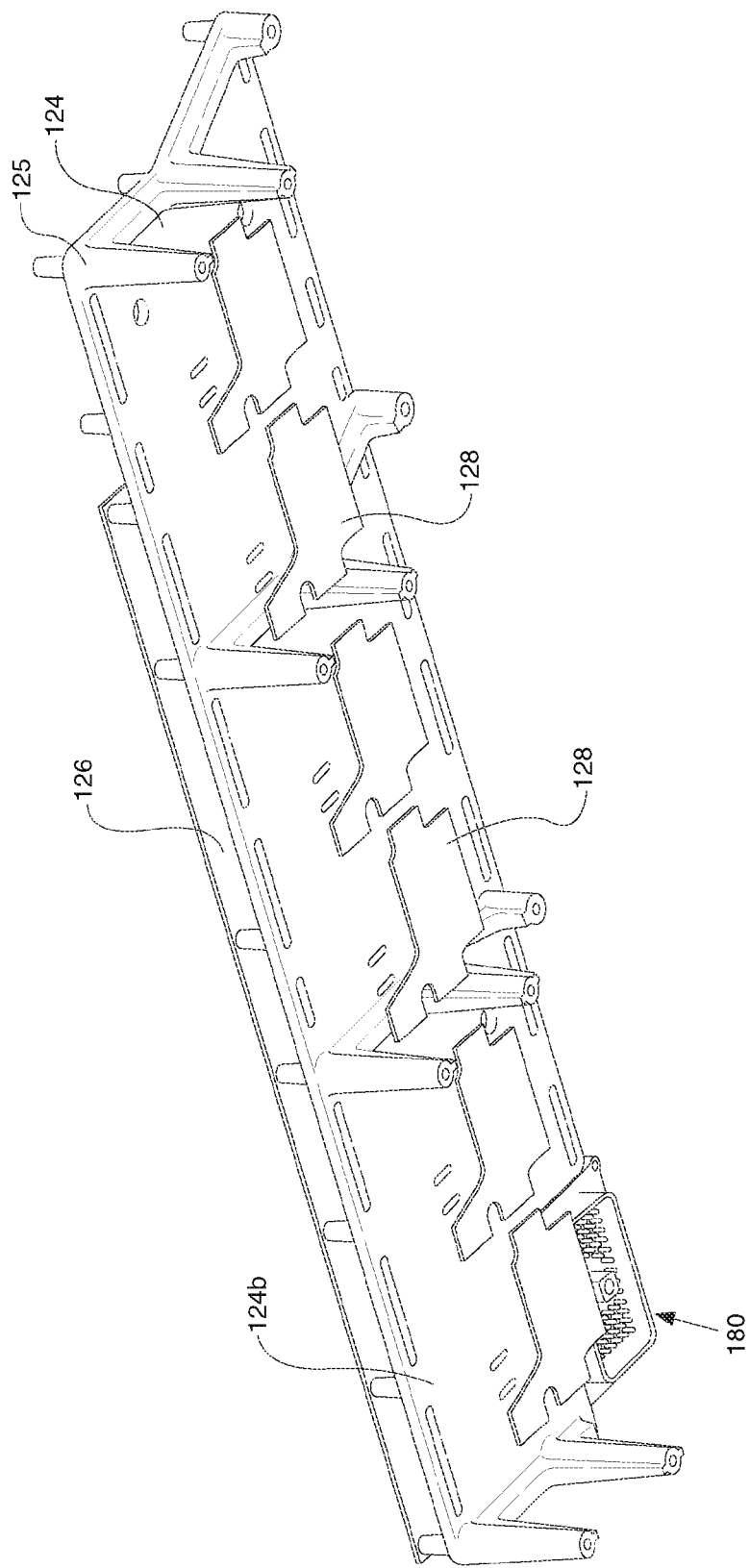
FIG. 13 is a detail view of the bottom surface of the control board and bridge of FIG. 11.

FIG. 11 illustrates the electronics assembly 10 shown packaged into housing 100, with the capacitor units 14, 16 positioned within wells 114, 116. Bridge 124 may be cast aluminum and is mounted to the heat transfer surface 118 via a plurality of standoffs 125 and positioned over IGBT modules 20-30 as described above. FIGS. 12 and 13 illustrate a first or top surface 124a and a second or bottom surface 124b of bridge 124, respectively. Control board 126 is mounted to first surface 124a, and a plurality of transistor drive boards 128 are in electrical communication with IGBT modules 20-30 along second surface 124b. Bridge 124 may be configured with an appropriate cut-out such that connector assembly 180 may extend directly through housing 100.

INDUSTRIAL APPLICABILITY

The present disclosure contemplates assembling a power converter which includes electronics assembly 10 for service in a new power system such as an electric propulsion system, as well as in a repaired or remanufactured electric power system. When a power converter from an electric propulsion system is removed from service, it may be expected that certain of the components need to be replaced, either as a preventative measure or because the components have in fact been damaged or degraded in performance. To this end, to repair or remanufacture a power converter according to the present disclosure each of the various components of electronics assembly 10 may be removed from a power converter housing, and the housing may be inspected, cleaned, etc.

The configuration of housing 100 allows for a unidirectional assembly—either during the initial build or during a subsequent repair or rebuild, such that once fluid passage cover 192 is mounted to the housing 100, electronics assembly 10 is assembled in one direction without having to turn the housing around. Mounting IGBT modules 20-30 directly to heat transfer surface 118 allows for heat transfer surface 118 to serve as a single mechanical, thermal, and ground reference plane. In addition, this configuration of housing 100 allows for an increased heat transfer and the elimination of a separate back plate or ground plate. Moreover, the monolithic construction of housing 100, with fluid passage 130 positioned opposite heat transfer surface 118 allows for a decreased risk of leaks inside power converter 11. In the event of a leak, coolant will likely leak on the rear side of housing 100, and not onto electronics assembly 10. The mounting of bridge 124 to heat transfer surface 118 provides for a rigid support of the control board 126 and transistor drive boards 128.

Certain components, such as DC bus bar 74 and AC electrical connection bars 88 and 90, may be reusable. In other instances, these components might be replaced due to corrosion, etc. To optimize future service life, and limit the risk of further problems, capacitor subassembly 12 and transistor subassembly 18 may each be replaced prior to returning the associated power converter to service. New capacitor units such as capacitor units 14 and 16 may be obtained, and arranged in the first packaging arrangement as described herein. New IGBT modules such as IGBT modules 20-30 may be obtained, and arranged in the second packaging arrangement as described herein. Capacitor subassembly 12 and transistor subassembly 18 may then be positioned as an assembled package in contact with housing 100 and coupled with DC bus bar 74 for subsequent service in a power converter.

In one embodiment, the first packaging arrangement may include a first heat dissipation/packing density configuration. In designing and/or making a power converter according to the present disclosure, the first packaging arrangement may be established or selected based on a plurality of different, and to a certain extent competing, concerns. One factor in establishing a suitable packaging configuration for capacitor subassembly 12 may include minimizing volume occupied by capacitor subassembly 12. A potentially competing concern may include providing for sufficient heat dissipation in a service environment. In most embodiments, packing density for capacitor subassembly 12 will tend to be a relatively larger concern than heat dissipation. In other words, while capacitor subassembly 12 will tend to produce heat during operation, capacitor subassembly 12 may have a relatively tightly packed configuration. Further still, capacitor subassembly 12 needs to have sufficient electrical storage capacity and needs to be positioned and shaped so that the overall shape of electronics assembly 10 when assembled enables robust and reliable electrical connections with transistor subassembly 18 to be readily made. The selection of two identical capacitor units 14, 16 having rectangular configurations, packing them relatively closely together so that they contact housing 100 on five of their six sides and orienting the major capacitor axes and minor capacitor axes as described herein addresses the various concerns which bear on selection of a suitable packaging arrangement for capacitor subassembly 12.

The second packaging arrangement may include a second heat dissipation/packing density configuration. The second packaging arrangement may likewise be established or selected based upon the concerns of minimizing a volume occupied by transistor subassembly 18 while still also allowing for sufficient heat dissipation. In contrast to capacitor subassembly 12, heat dissipation will tend to be of relatively greater concern in establishing a packaging arrangement for transistor subassembly 18 than will packing density. This is due in part to the relatively high level of heat generated by transistor subassembly 18. Ease of establishing appropriate electrical connections with transistor subassembly may also be a factor, as well as how the shape of transistor subassembly 18 and the shape of capacitor subassembly 12 relate in three-dimensional space. The selection of six identical rectangular IGBT modules 20-30, arranging IGBT modules 20-30 in identical orientations, orienting heat dissipation surface(s) 72 in a common heat transfer plane and orienting the major module axes and minor module axes as described herein address the various concerns which bear on selection of a suitable packaging arrangement for transistor subassembly 18.

For the reasons described above, it may thus be appreciated that a variety of concerns bear on exactly how capacitor subassembly 12 and transistor subassembly 18 are respectively packaged. Other concerns relate to how transistor subassembly 18 and capacitor subassembly 12 are positioned in three-dimensional space relative to one another. It will generally be desirable to position capacitor subassembly 12 relatively close to transistor subassembly 18 to limit inductance between electrical conductors of electronics assembly 10. In one embodiment, connecting capacitor subassembly 12 with transistor subassembly 18 may include electrically connecting capacitor subassembly 12 with transistor subassembly 18 in an inductance limiting arrangement, such as by connecting capacitor subassembly 12 with transistor subassembly 18 by way of DC bus bar 74, and placing transistor subassembly 18 such that it abuts capacitor subassembly 12. It will generally be desirable to position capacitor subassembly 12 and transistor subassembly 18 as close together as possible. Positioning capacitor subassembly 12 and transistor subassembly 18 close together, however, will typically need to be tempered by the need to dissipate heat and also by the need for a relatively straightforward and robust mechanism for establishing electrical connections therebetween. Accordingly, the described shape of DC bus bar 74, including its stepped profile enables positioning transistor subassembly 18 such that a first module end illustrated via first module end 54 of IGBT module 30 abuts capacitor subassembly 14. This general configuration has been shown to limit inductance between and among the components, while also addressing the concerns of heat dissipation and packing density. Still another concern in positioning capacitor subassembly 12 and transistor subassembly 18 in three-dimensional space relates to providing a compact arrangement which accommodates control board 126 and bridge 124. As described above, control board 126 and bridge 124 may be positioned at least partially between planes Q and R, addressing this concern.

The present description is for illustrative purposes only, and should not be construed to narrow the breadth of the present disclosure in any way. Thus, those skilled in the art will appreciate that various modifications might be made to the presently disclosed embodiments without departing from the full and fair scope and spirit of the present disclosure. Other aspects, features and advantages will be apparent upon an examination of the attached drawings and appended claims.

What is claimed is:

1. A power converter assembly comprising:
   a housing having a liquid cooled heat transfer surface, at least one fluid cooling passage positioned opposite the liquid cooled heat transfer surface, and at least one divider positioned in the at least one fluid cooling passage;
   at least one transistor module mounted directly to the liquid cooled heat transfer surface and positioned at least partially within the housing, wherein the at least one transistor module is secured to at least a portion of the at least one divider;
   a bridge mounted to the heat transfer surface and positioned over the at least one transistor module;
   a control board mounted to the bridge and in communication with the at least one transistor module; and
   at least one transistor drive board positioned between the bridge and the at least one transistor module,
      wherein the control board is in communication with the at least one transistor module through the at least one transistor drive board.

2. The power converter assembly of claim 1, further comprising:
   at least one capacitor mounted to the housing and positioned at least partially within the housing.

3. The power converter assembly of claim 1, wherein the control board is mounted to a first surface of the bridge and the at least one transistor drive board is positioned adjacent a second surface of the bridge opposite the first surface.

4. The power converter assembly of claim 1, further comprising a connector assembly mounted to the control board and extending through an opening in the housing.

5. The power converter assembly of claim 1, wherein the housing has at least one divider positioned in the at least one fluid cooling passage, and the bridge is secured to at least a portion of the at least one divider.

6. The power converter assembly of claim 1, wherein the at least one fluid cooling passage is U-shaped.

7. The power converter assembly of claim 1, further comprising:
   a cover mounted to a periphery of the housing.

8. The power converter assembly of claim 1, further comprising:
   a fluid cooling passage cover mounted to the housing and fluidly sealing the at least one fluid cooling passage.

9. The power converter assembly of claim 1, wherein the housing is monolithic.

10. The power converter assembly of claim 2, wherein the housing has at least one well and the at least one capacitor is positioned within the at least one well.

11. The power converter assembly of claim 1, further comprising:
    a plurality of transistor modules mounted directly to the liquid cooled heat transfer surface and positioned at least partially within the housing;
       wherein the bridge is positioned over the plurality of transistor modules.

12. A machine comprising:
    an engine;
    an electrical generator coupled to the engine;
    a power converter in communication with the electrical generator and having a housing with a liquid cooled heat transfer surface and at least one transistor module mounted directly to the liquid cooled heat transfer surface and positioned at least partially within the housing, the housing having at least one fluid cooling passage positioned opposite the liquid cooled heat transfer surface and at least one divider positioned in the at least one fluid cooling passage, the at least one transistor module being secured to at least a portion of the at least one divider;
    at least one electric propulsion motor in communication with the power converter;
    a bridge mounted to the heat transfer surface and positioned over the at least one transistor module;
    a control board mounted to the bridge and in communication with the at least one transistor module; and
    at least one transistor drive board positioned between the bridge and the at least one transistor module,
    wherein the control board is in communication with the at least one transistor module through the at least one transistor drive board.

13. A power converter assembly comprising:
    a housing having a liquid cooled heat transfer surface;
    at least one cooling fluid passage positioned opposite the liquid cooled heat transfer surface;
    at least one divider positioned in the at least one cooling fluid passage;
    at least one transistor module mounted directly to the liquid cooled heat transfer surface and positioned at least partially within the housing;
    a bridge mounted to the heat transfer surface and positioned over the at least one transistor module;
    a control board mounted to the bridge and in communication with the at least one transistor module; and
    at least one transistor drive board positioned between the bridge and the at least one transistor module,
    wherein the control board is in communication with the at least one transistor module through the at least one transistor drive board.

* * * * *